(12) United States Patent
Cushen et al.

(10) Patent No.: US 9,458,531 B2
(45) Date of Patent: Oct. 4, 2016

(54) METHOD FOR DIRECTED SELF-ASSEMBLY (DSA) OF BLOCK COPOLYMERS USING GUIDING LINE SIDEWALLS

(71) Applicant: HGST Netherlands B.V., Amsterdam (NL)

(72) Inventors: Julia Cushen, Mountain View, CA (US); Ricardo Ruiz, Santa Clara, CA (US); Lei Wan, San Jose, CA (US)

(73) Assignee: HGST Netherlands B.V., Amsterdam (NL)

(*) Notice: Subject to any disclaimer, the term of this patent is extended or adjusted under 35 U.S.C. 154(b) by 30 days.

(21) Appl. No.: 14/532,240

(22) Filed: Nov. 4, 2014

(65) Prior Publication Data
US 2016/0122859 A1 May 5, 2016

(51) Int. Cl.
*B44C 1/22* (2006.01)
*C23C 14/04* (2006.01)

(52) U.S. Cl.
CPC .................................. *C23C 14/042* (2013.01)

(58) Field of Classification Search
CPC ...... G03G 7/00; G03G 7/002; G03G 7/0053; G03G 7/006; G03G 7/0073; C23C 14/00; C03C 25/68; H01L 21/3088; H01L 21/3081; H01L 21/306
USPC ......... 216/11, 39, 40, 46, 47, 49, 55, 67, 72, 216/81
See application file for complete search history.

(56) References Cited

U.S. PATENT DOCUMENTS

| | | | |
|---|---|---|---|
| 7,976,715 B2 | 7/2011 | Dobisz et al. | |
| 8,059,350 B2 | 11/2011 | Albrecht et al. | |
| 8,119,017 B2 | 2/2012 | Albrecht et al. | |
| 8,568,604 B2* | 10/2013 | Doris | H01L 21/0337 216/41 |
| 8,821,978 B2* | 9/2014 | Cheng | B81C 1/00031 427/258 |
| 9,005,877 B2* | 4/2015 | Rathsack | G03F 7/0002 430/313 |
| 2009/0266790 A1* | 10/2009 | Balamane | G11B 5/3903 216/22 |
| 2009/0308837 A1* | 12/2009 | Albrecht | G11B 5/855 216/22 |
| 2014/0087016 A1 | 3/2014 | Gao et al. | |

OTHER PUBLICATIONS

Bates et al., "Polarity-Switching Top Coats Enable Orientation of Sub-10-nm Block Copolymer Domains", Science 338, 775 (2012).
Cushen et al., "Ordering Poly(trimethylsilyl styrene-block-D,L-lactide) Block Copolymers in Thin Films by Solvent Annealing Using a Mixture of Domain-Selective Solvents", Journal of Polymer Science, Part B: Polymer Physics 2014, 52, 36-45.

* cited by examiner

*Primary Examiner* — Lan Vinh
(74) *Attorney, Agent, or Firm* — Thomas R. Berthold

(57) ABSTRACT

A guiding pattern for directed self-assembly (DSA) of a block copolymer (BCP) is an array of spaced guiding stripes on a substrate that have a width equal to $nL_0$ and a pitch equal to $(n+k)L_0$, where n and k are integers equal to or greater than 1 and $L_0$ is the natural pitch of the BCP. The guiding stripes have oxidized sidewalls. A silicon-containing BCP self-assembles with the BCP component without silicon wetting the oxidized sidewalls. Then oxygen reactive ion etching (RIE) removes the BCP component without silicon and oxidizes the silicon-containing BCP component. The remaining pattern of silicon oxide containing BCP component can then be used as an etch mask to etch the underlying substrate.

20 Claims, 7 Drawing Sheets

20nm

20nm

20nm

20nm

METHOD FOR DIRECTED SELF-ASSEMBLY (DSA) OF BLOCK COPOLYMERS USING GUIDING LINE SIDEWALLS

BACKGROUND OF THE INVENTION

1. Field of the Invention

This invention relates generally to the directed self-assembly (DSA) of block copolymers (BCPs), and more particularly to the DSA of BCPs to make an etch mask for pattern transfer into a substrate.

2. Description of the Related Art

Directed self-assembly (DSA) of block copolymers (BCPs) has been proposed for making imprint templates. Imprint templates have application in making patterned-media magnetic recording disks and in semiconductor manufacturing, for example, for patterning parallel generally straight lines in MPU, DRAM and NAND flash devices. DSA of BCPs by use of a patterned sublayer that provides a chemical contrast pattern for the BCP film is well-known. After the BCP components self-assemble on the patterned sublayer, one of the components is selectively removed, leaving the other component with the desired pattern, which can then be used as an etch mask to transfer the pattern into an underlying substrate. The etched substrate can be used as an imprint template.

In conventional DSA by use of a chemical contrast pattern, an array of sparse guiding lines, usually made of a cross-linkable polymer mat, is lithographically patterned on the substrate. The pitch of these guiding lines (Ls) needs to be an integer multiple of the natural pitch ($L_0$) formed by the block copolymer to be directed, i.e., Ls=$nL_0$, where n is an integer equal to or greater than 1. However, the width of the guiding lines generally needs to be about 0.5 $L_0$, or nearly equal to the width of one of the block copolymer components. While lithographic applications benefit from the fact that the guiding lines can be sparse (at a pitch of $nL_0$) and that the high density comes from the density multiplication afforded by the block copolymers, the resolution requirement to pattern the width of the guiding lines keeps scaling with the final block copolymer dimensions. As lithographic applications advance to smaller dimensions, especially below 20 nm full pitch, the fabrication of guiding lines with a width below 10 nm while maintaining adequate roughness and width uniformity becomes ever more difficult and beyond what is possible with current resist materials for electron-beam (e-beam) or optical lithography.

What is needed is a guiding pattern for DSA with a width larger than the half pitch of the final block copolymer pattern to make it easier to fabricate the etch mask.

SUMMARY OF THE INVENTION

In embodiments of this invention the guiding pattern for DSA is an array of generally equally spaced guiding stripes with a width equal to $nL_0$ and a pitch equal to $(n+k)L_0$, where n and k are integers equal to or greater than 1 and $L_0$ is the natural pitch of the BCP. This makes it easier to fabricate high quality chemical contrast patterns for DSA below 20 nm full pitch. Unlike the prior art, the chemical contrast is generated by the chemistry on the sidewalls of the guiding stripes.

A cross-linked polymer mat layer is deposited on a suitable substrate. Then a resist layer is patterned on the mat layer into a plurality of spaced resist stripes having a width substantially equal to $nL_0$ and a pitch substantially equal to $(n+k)L_0$, where n and k are integers equal to or greater than 1. An oxygen reactive ion etching (RIE) of the exposed mat removes the mat layer between the resist stripes, leaving a plurality of mat guiding stripes with oxidized sidewalls. After the resist is removed, a layer of polymer brush material is deposited onto the substrate between the guiding stripes and heated to bind it to the substrate. After removal of the unbound polymer brush material, the bound polymer brush material between the guiding stripes has a thickness less than the thickness of the guiding stripes so that the oxidized sidewalls of the guiding stripes are exposed. Then a silicon-containing BCP is spin-coated on the guiding stripes and bound brush material. The subsequent heating of the BCP causes the BCP component without silicon to wet the oxidized sidewalls and the BCP to thereby self-assemble into the two BCP components on the guiding stripes and bound brush material. Then a second oxygen RIE removes the BCP component without silicon and oxidizes the silicon-containing BCP component. The remaining pattern of silicon oxide containing BCP component can then be used as an etch mask to etch the underlying substrate.

For a fuller understanding of the nature and advantages of the present invention, reference should be made to the following detailed description taken together with the accompanying figures.

DETAILED DESCRIPTION OF THE INVENTION

Figure 1A:
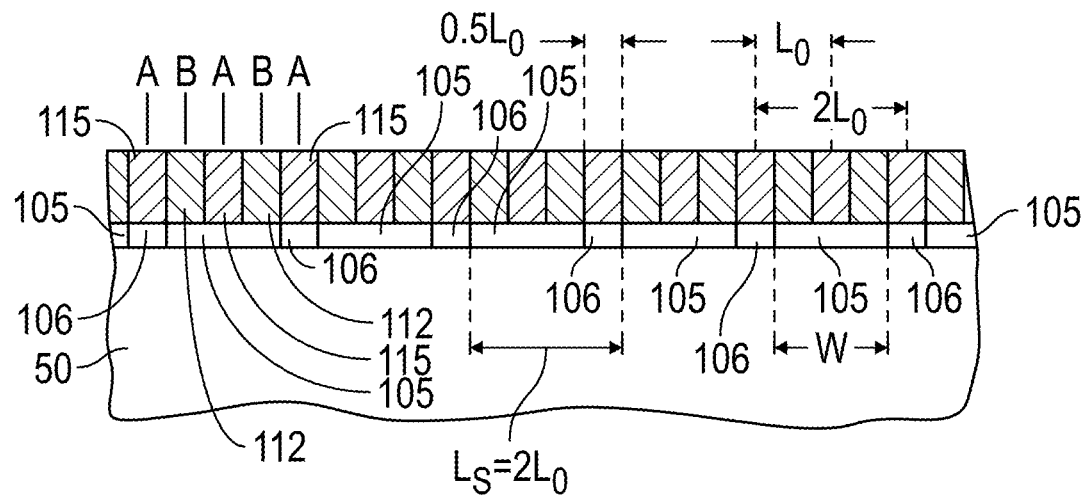
FIGS. 1A-1D are views illustrating the prior art method for making an imprint template using directed self-assembly (DSA) of block copolymers (BCPs).

Self-assembling block copolymers (BCPs) have been proposed for creating periodic nanometer (nm) scale features. Self-assembling BCPs typically contain two or more different polymeric block components, for example components A and B, that are immiscible with one another. Under suitable conditions, the two or more immiscible polymeric block components separate into two or more different phases or microdomains on a nanometer scale and thereby form ordered patterns of isolated nano-sized structural units. There are many types of BCPs that can be used for forming the self-assembled periodic patterns. If one of the components A or B is selectively removable without having to remove the other, then an orderly arranged structural units of the un-removed component can be formed.

Specific examples of suitable BCPs that can be used for forming the self-assembled periodic patterns include, but are not limited to: poly(styrene-block-methyl methacrylate) (PS-b-PMMA), poly(ethylene oxide-block-isoprene) (PEOb-PI), poly(ethylene oxide-block-butadiene) (PEO-b-PBD), poly(ethylene oxide-block-styrene) (PEO-b-PS), poly(ethylene oxide-block-methylmethacrylate) (PEO-b-PMMA), poly(ethyleneoxide-block-ethylethylene) (PEO-b-PEE), poly(styrene-block-vinylpyridine) (PS-b-PVP), poly(styrene-block-isoprene) (PS-b-PI), poly(styrene-block-butadiene) (PS-b-PBD), poly(styrene-block-ferrocenyldimethylsilane) (PS-b-PFS), poly(butadiene-block-vinylpyridine) (PBD-b-PVP), poly(isoprene-block-methyl methacrylate) (PI-b-PMMA), poly(styrene-block-lactic acid) (PS-b-PLA) and poly(styrene-block-dymethylsiloxane) (PS-b-PDMS).

The specific self-assembled periodic patterns formed by the BCP are determined by the molecular volume ratio between the first and second polymeric block components A and B. When the ratio of the molecular volume of the second polymeric block component B over the molecular volume of the first polymeric block component A is less than about 80:20 but greater than about 60:40, the BCP will form an ordered array of cylinders composed of the first polymeric block component A in a matrix composed of the second polymeric block component B. When the ratio of the molecular volume of the first polymeric block component A over the molecular volume of the second polymeric block component B is less than about 60:40 but is greater than about 40:60, the BCP will form alternating lamellae composed of the first and second polymeric block components A and B. When the ratio of B over A is greater than about 80:20 the BCP will form an ordered array of spheres in a matrix of the second component. For lamellar or cylinder forming BCPs, the orientation of the lamellae or the cylinders with respect to the substrate depends on the interfacial energies (wetting properties) of the block copolymer components at both the substrate interface and at the top interface. When one of the block components preferentially wets the substrate (or the top free interface) the block copolymers form layers parallel to the substrate. When the wetting properties at the interface are neutral to either block, then both block components can be in contact with the interface, facilitating the formation of block copolymer domains with perpendicular orientation. In practice, the wetting properties of the substrate are engineered by coating the substrate with "surface modification layers" that tune the wetting properties at the interface. Surface modification layers are usually made of polymer brushes or mats typically (but not necessarily) composed of a mixture of the constituent block materials of the BCP to be used.

The periodicity or natural pitch ($L_0$) of the repeating structural units in the periodic pattern BCP components is determined by intrinsic polymeric properties such as the degree of polymerization N and the Flory-Huggins interaction parameter $\lambda$. $L_0$ scales with the degree of polymerization N, which in turn correlates with the molecular weight M. Therefore, by adjusting the total molecular weight of the BCP, the natural pitch ($L_0$) of the repeating structural units can be selected.

To form the self-assembled periodic patterns, the BCP is first dissolved in a suitable solvent system to form a BCP solution, which is then applied onto a surface to form a thin BCP layer, followed by annealing of the thin BCP layer, which causes phase separation between the different polymeric block components contained in the BCP. The solvent system used for dissolving the BCP and forming the BCP solution may comprise any suitable non-polar solvent, including, but not limited to: toluene, methylisobutylketone (MIBK), propylene glycol monomethyl ether acetate (PGMEA), propylene glycol monomethyl ether (PGME), and acetone. The BCP solution can be applied to the substrate surface by any suitable techniques, including, but not limited to: spin casting, coating, spraying, ink coating, dip coating, etc. Preferably, the BCP solution is spin cast onto the substrate surface to form a thin BCP layer. After application of the thin BCP layer onto the substrate surface, the entire substrate is annealed to effectuate microphase segregation of the different block components contained by the BCP, thereby forming the periodic patterns with repeating structural units.

The BCP films in the above-described techniques self-assemble without any direction or guidance. This undirected self-assembly results in patterns with defects so it is not practical for applications that require long-range ordering, such as imprint templates for bit-patterned media or integrated circuits. However, directed self-assembly (DSA) of block copolymers (BCPs) has been proposed for making imprint templates for bit-patterned media or integrated circuits. DSA of BCPs by use of a patterned sublayer that acts as a chemical contrast pattern for the BCP film is well-known, as described for example in U.S. Pat. No. 7,976,715; U.S. Pat. No. 8,059,350; and U.S. Pat. No. 8,119,017. Pending application Ser. No. 13/627,492, published as US 2014/0087016 A1 and assigned to the same assignee as this application, describes the use DSA of BCPs to make two submaster imprint templates, one with a pattern of generally radial lines, and the other with generally concentric rings, to make a master imprint template, which is then used to imprint patterned-media magnetic recording disks. Imprint templates made with DSA of BCPs have also been proposed for use in semiconductor manufacturing, for example, for patterning parallel generally straight lines in MPU, DRAM and NAND flash devices.

The prior art method for making an imprint template using DSA of BCPs will be described in general terms with FIGS. 1A-1D for an example where the template 50 will become an imprint template with protrusions in a pattern of generally equally spaced bars. FIG. 1A is a side sectional view showing the substrate (template 50), which may be formed of silicon, with a patterned sublayer of spaced guiding lines or stripes 106 and intermediate brush regions 105. A cross-linked polymer mat of the same material as guiding stripes 106 is first deposited as a full film on the substrate. The cross-linkable polymer may be spin-coated on the substrate to a thickness of 4-15 nm. The as-spun film is then annealed or treated by UV light for the cross-linking units to carry out the cross-linking. After cross-linking, the cross-linked polymer layer is typically referred as a mat layer. The film thickness is similar to that of the as-spun layer. Then a resist layer is patterned on the mat layer to form a pattern of resist stripes. The mat layer is then etched to remove portions not protected by the resist. After removal of the resist a polymer brush layer is deposited onto the substrate to substantially the same thickness as the mat, leaving the pattern of mat stripes 106 and polymer brush material 105 between the mat stripes. A brush layer is a monolayer of a functional polymer grafted on the substrate. The as-spun film is annealed for the functional groups to graft to the substrate surface. After annealing, any ungrafted brush material is rinsed away in a suitable solvent (e.g., toluene, PGMA, or NMP). The thickness of the brush layer is typically the same as the thickness of the mat layer, and is determined by the properties of the functional polymer, such as chemistry, molecular weight, and location of the functional group.

In FIG. 1A there are there are numerous possible material combinations for the stripes 106 and brush regions 105 that form the chemical contrast patterned sublayer. For instance, the stripes 106 and regions 105 can be exposed silicon substrate and a PS-rich functionalized random copolymer PS-r-PMMA brush, respectively; exposed silicon substrate and a low molecular weight functionalized PS brush, respectively; exposed silicon substrate and a PS-rich cross-linked random copolymer PS-r-PMMA mat, respectively; cross-linked PMMA mat and a PS-rich functionalized random copolymer PS-r-PMMA brush, respectively; cross-linked PS mat and a PMMA-rich functionalized random copolymer PS-r-PMMA brush, respectively; e-beam resist HSQ (hydrogen silsesquioxane) and a PS-rich functionalized random copolymer PS-r-PMMA brush, respectively; a functionalized PS brush and a PMMA-rich cross-linked random copolymer PS-r-PMMA mat, respectively; or a functionalized PMMA brush and a PS-rich cross-linked random copolymer PS-r-PMMA mat, respectively.

Figure 1B:
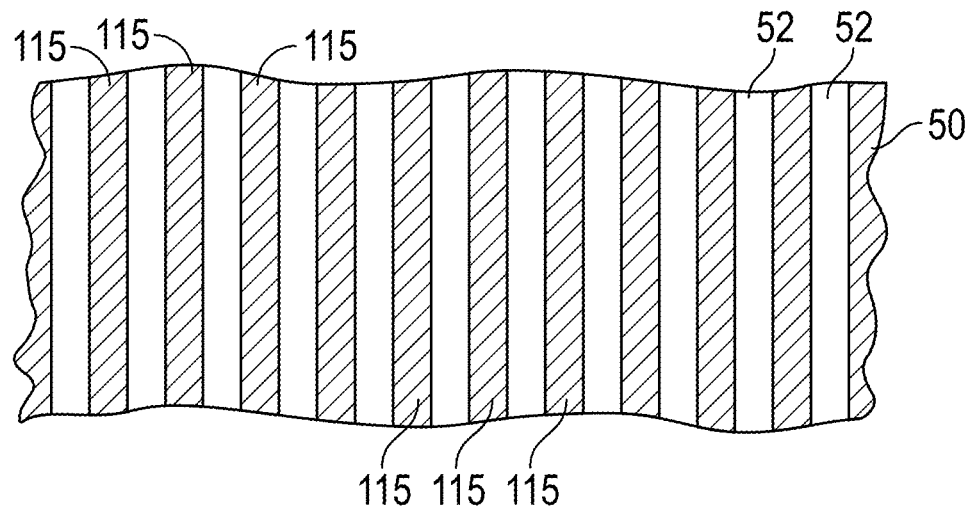
Figure 1C:
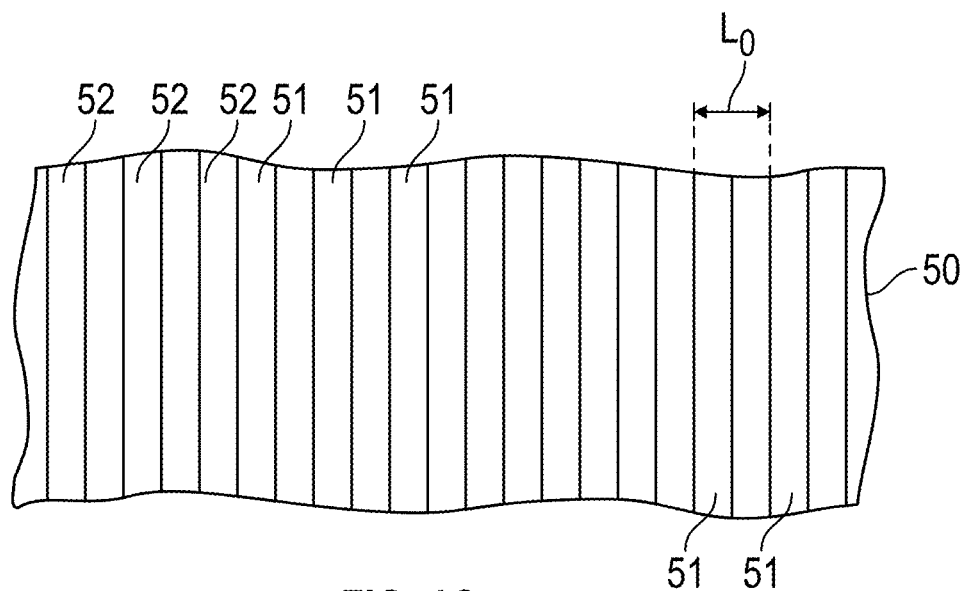
Figure 1D:
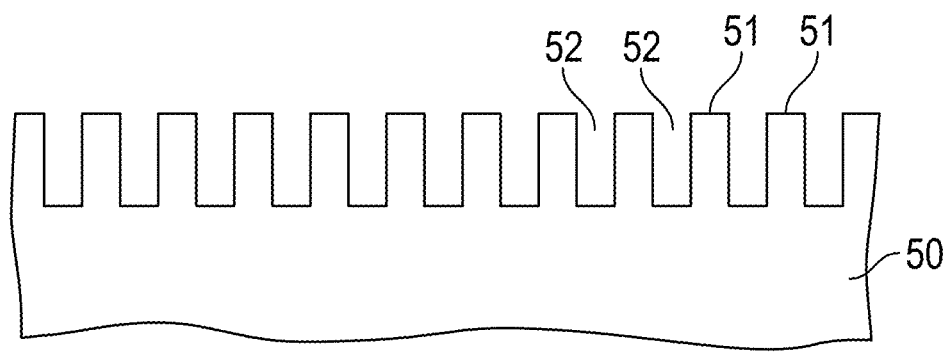

In FIG. 1A, the PS-b-PMMA BCP has been spin-coated on the patterned sublayer and annealed. This causes DSA of the BCP into alternating A component polystyrene (PS) parallel lines 115 and B component (PMMA) parallel lines 112 on the mat stripes 106 and brush regions 105. The mat layer has been patterned to direct the self-assembly of the BCP A and B components with a natural pitch of $L_0$. In this example the stripes 106 have a width W of 0.5 $L_0$ and a stripe pitch $L_S$ of $2L_0$. In FIG. 1B, the portions of lines 112, the B component (PMMA), are then selectively removed by a wet etch or a dry etch process. This leaves lines 115 of the A component (PS) on the template 50. Then, a dry etch process is used to etch the template 50 to form recesses 52 using the lines 115 as the etch mask. The material of lines 115 and the remaining underlying sublayer 105 is then removed, leaving recesses 52 in template 50. This leaves the structure as shown in FIG. 1C, with a pattern of protrusions formed as bars 51 and recesses 52. FIG. 1D is a side sectional view of the resulting imprint template. The spaced bars 51 may be parallel generally straight lines with a spacing of $L_0$, as shown in FIG. 1C, for example for making an imprint template for use in making MPU, DRAM and NAND flash devices. The spaced bars 51 may also be concentric rings or radial lines for making an imprint template for use in making patterned-media magnetic recording disks. If the bars are radial lines they may have a spacing as small as $0.9L_0$ at the radially inner point and as large as $1.1L_0$ at the radially outer point.

The problem with the prior art DSA method is the difficulty in lithographically forming the guiding lines or stripes 106 with a width of $0.5L_0$. As lithographic applications advance to smaller dimensions, especially below 20 nm full pitch, fabricating guiding lines with a width below 10 nm while maintaining adequate roughness and width uniformity becomes ever more difficult and beyond what is possible with current resist materials for e-beam or optical lithography.

In embodiments of this invention the guiding pattern for DSA is an array of generally equally spaced guiding stripes with a width equal to $nL_0$ and a pitch equal to $(n+k)L_0$, where n and k are integers equal to or greater than 1 and $L_0$ is the natural pitch of the BCP. This makes it easier to fabricate high quality chemical contrast patterns for DSA below 20 nm full pitch. Unlike the prior art, the chemical contrast is generated by the chemistry on the sidewalls of the guiding stripes.

Figure 2A:
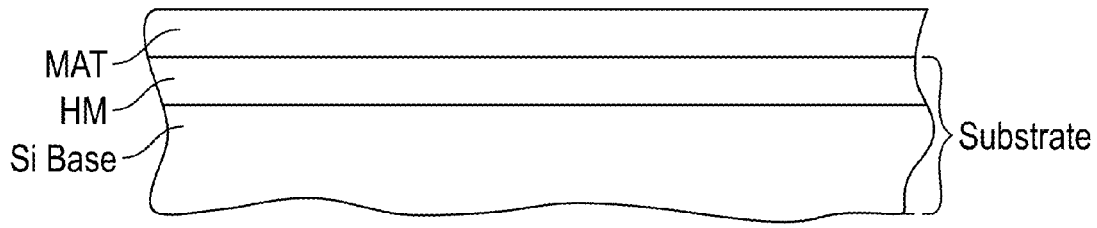
FIGS. 2A-2G are schematic sectional views illustrating steps for making an etched substrate using the DSA method of BCPs according to embodiments of this invention.

FIGS. 2A-2G are schematic sectional views illustrating steps in the DSA method according to embodiments of this invention. In FIG. 2A, the substrate in this example is a single-crystal silicon (Si) base with a hard mask (HM) layer, for example a diamond-like carbon (DLC) layer with a thickness of about 17 nm. The substrate may be formed of any suitable material, such as but not limited to, single-crystal Si, amorphous Si, silica, fused quartz, silicon nitride, carbon, tantalum, molybdenum, chromium, alumina or sapphire, with or without a HM layer. A cross-linked polymer mat layer (MAT), in this example a cross-linked polystyrene (XPS) mat layer, has been formed to a thickness of about 8 nm on the HM layer.

Figure 2B:
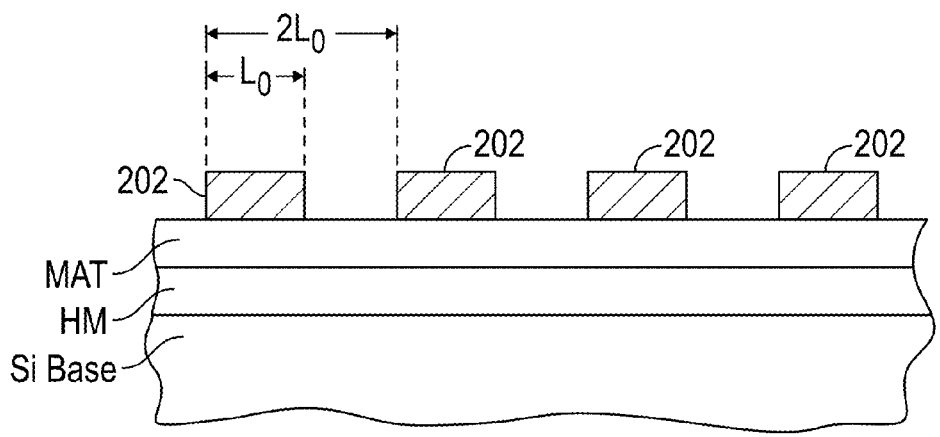

In FIG. 2B, a resist layer has been deposited on the MAT and lithographically patterned by e-beam to form generally equally spaced resist stripes 202 with a width substantially equal to $nL_0$, where n is an integer equal to or greater than 1 and $L_0$ is the natural pitch of the BCP to be subsequently deposited. The resist stripes 202 may have a pitch substantially equal to $(n+k)L_0$, where k is also equal to or greater than 1. In this example, n=1 and k=1, so the pitch is $2L_0$. Because it may not be possible to precisely match the width and spacing of the resist stripes to $L_0$ during the e-beam lithographic process, the phrase "substantially equal" as used herein shall mean the referenced term plus or minus 10%. The e-beam writing of the resist can create spaced stripes 202 that are substantially parallel, that are concentric rings or that are generally radial lines. In this example the generally equally spaced resist stripes 202 are represented as parallel stripes.

Figure 2C:
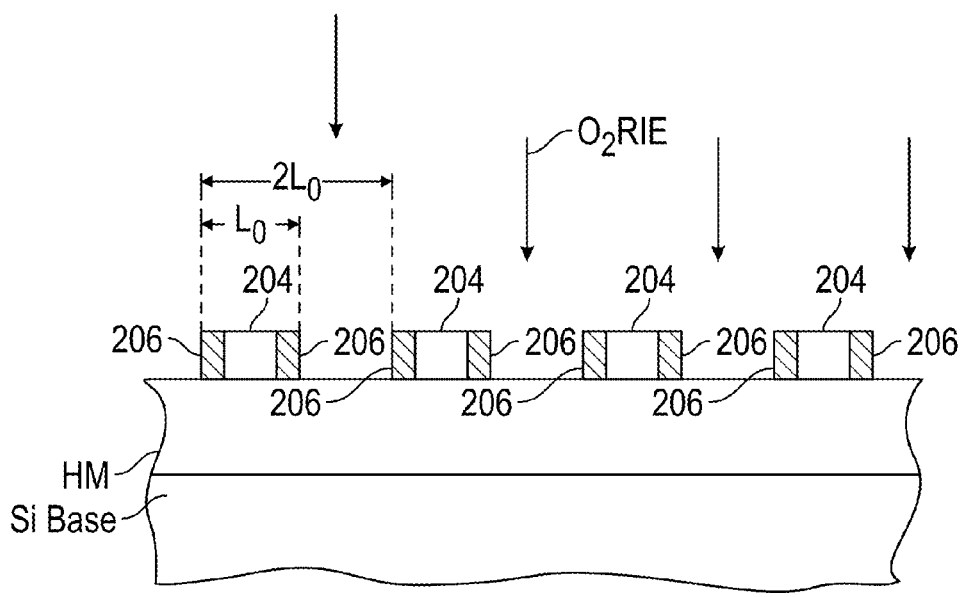

In FIG. 2C, the MAT has been etched by reactive ion etching (RIE) in an oxygen gas, using the resist stripes 202 as an etch mask, after which the resist has been removed. This leaves guiding lines or stripes 204 of mat material. However, the RIE oxygen process has also oxidized the polystyrene to form oxidized sidewalls 206 on the mat guiding stripes 204.

Figure 2D:
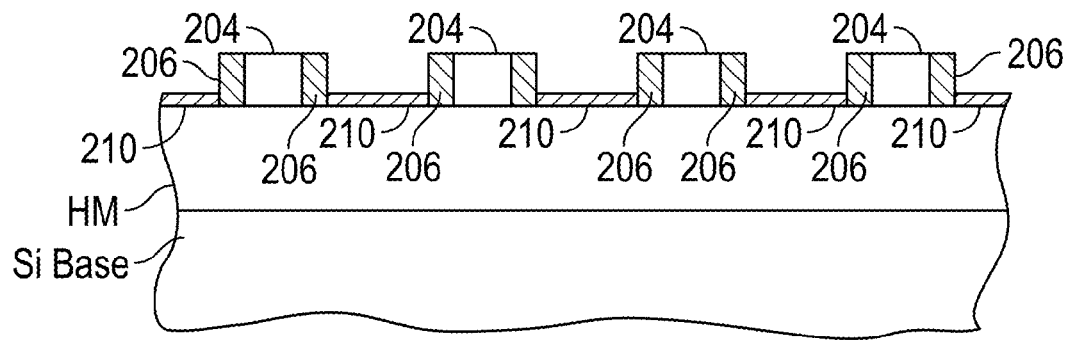

In FIG. 2D, a polymer brush material 210 has been grafted onto the HM between the guiding stripes 204 and then the ungrafted polymer brush material has been rinsed away. A brush layer is a monolayer of a functional polymer grafted on the substrate, in this case on the HM. The as-spun film is thermally annealed for the functional groups to bind to the substrate surface. After annealing, any unbound brush material is rinsed away in a suitable solvent (e.g., toluene, PGMA, or NMP). In this example the brush material may be low molecular weight (e.g., 1.2 kg/mol) OH-terminated polystyrene. This leaves the bound brush material 210 between the mat guiding stripes 204. The brush material 210 has a thickness substantially less than the thickness of the mat guiding stripes 204 so that the oxidized sidewalls 206 are exposed and not covered with brush material. The difference between the thickness of the mat guiding stripes 204 and the brush material 210 should be at least 2 nm and preferably less than or equal to 10 nm. For example, if the MAT layer has a thickness of about 8 nm, the bound brush material may have a thickness of about 1-2 nm. The thickness of the brush layer is determined by the properties of the functional polymer, such as chemistry, molecular weight, and location of the functional group.

Figure 2E:
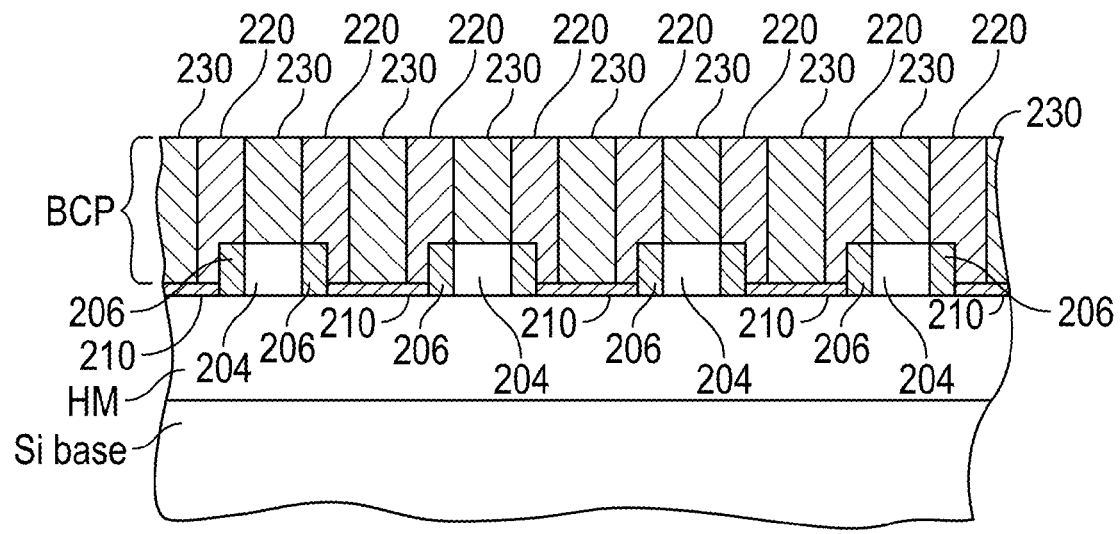

In FIG. 2E a BCP has been deposited over the mat guiding stripes 204 and brush material 210 and annealed. This results in self-assembly of the two BCP components 220, 230 as lamellae perpendicular to the substrate. The self-assembly is guided by the oxidized sidewalls 206 of the mat guiding stripes 204. The more polar BCP component 220 wets the polar oxide, while the other BCP component 230 has no strong preference to wet either the polar oxide or the brush material and is forced to self-assemble between the components 220. In the preferred embodiment the BCP is a silicon-containing BCP, such as, but not limited to, poly (styrene-block-dimethylsiloxane) (PS-b-PDMS), poly(trimethylsilylstyrene-block-D,L lactide) (PTMSS-b-PLA), poly (styrene-block-trimethylsilylstyrene-block-styrene) (PS-b-PTMSS-b-PS) or poly(trimethylsilyl styrene)-block-poly (methoxystyrene) (PTMSS-b-PMOST). In this example the BCP is (PTMSS-b-PMOST). PTMSS-b-PMOST, as well as (PS-b-PDMS), (PTMSS-b-PLA) and (PS-b-PTMSS-b-PS), are desirable because they have a natural pitch $L_0$ less than 20 nm. In two examples for making test specimens, the PTMSS-b-PMOST BCP had $L_0$ of 17.4 nm and 19.9 nm. The PTMSS-b-PMOST is dissolved in a solution of toluene and spin-coated over the mat guiding stripes 204, with exposed oxidized sidewalls 206, and brush material 210. A polarity switching topcoat is then spin-coated onto the BCP. The polarity switching topcoat acts to modify the upper surface of the BCP to modify the surface energy of the free surface interface and to enable the block copolymer domains to orient perpendicular to the plane of the substrate. The topcoat material and solution is described by Bates et al., "Polarity-Switching Top Coats Enable Orientation of Sub-10-nm Block Copolymer Domains", *Science* 338, 775 (2012). The BCP is then thermally annealed, for example to a temperature of about 200° C. for about 1.5 minutes. The topcoat is then removed with a solution of 4:1 methanol: 45% trimethylamine in water. The PMOST, shown as BCP component 220 in FIG. 2E, wets the oxidized sidewalls 206. This results in self-assembly of the PTMSS, shown as BCP component 230 in FIG. 2E, on tops of the mat guiding stripes 204 and in the centers of the brush material 210 between the mat guiding stripes 204.

Figure 2F:
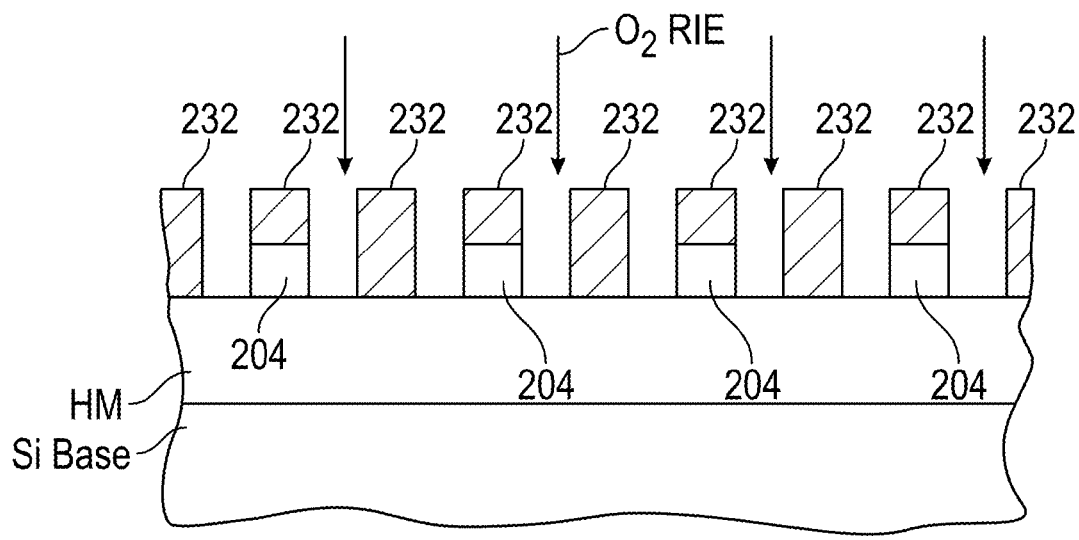

In FIG. 2F an oxygen RIE process has removed the PMOST component and the brush material, as well as the oxidized sidewalls on the mat guiding stripes 204. The oxygen RIE process has also oxidized the Si in the PTMSS, creating $SiO_2$ in the PTMSS component, leaving pillars 232 of PTMSS with $SiO_2$, which now have a substantially reduced thickness from the PTMSS component 230 in FIG. 2E. The pillars 232 of oxidized PTMSS will serve as an etch mask to etch the underlying HM layer.

Figure 2G:
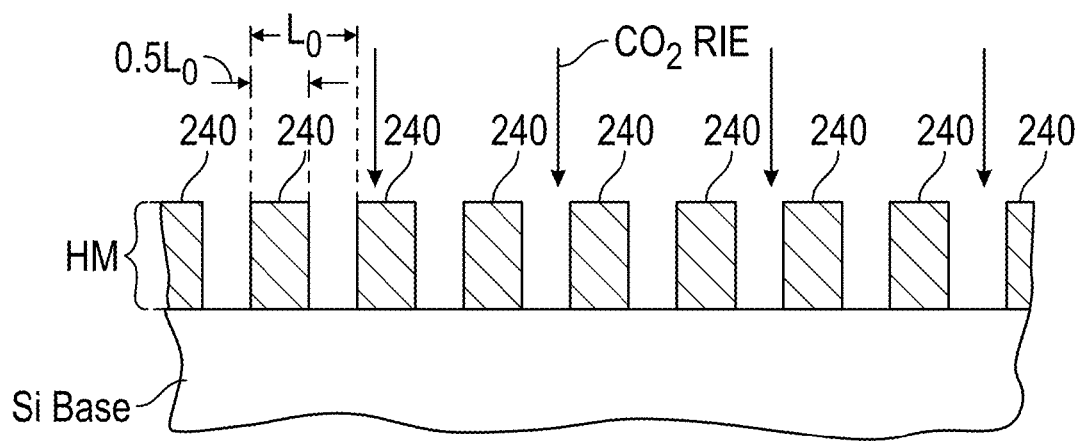

In FIG. 2G, the HM has been etched in a $CO_2$ RIE process using the $SiO_2$ containing PTMSS pillars 232 (FIG. 2F) as an etch mask. Since the silicon in the PTMSS oxidizes during the first oxygen RIE step and $SiO_2$ is not a good etch mask for pattern transfer into a silicon substrate, the DLC HM layer is used as a transfer layer between the oxidized PTMSS and the silicon base. The etching leaves pillars 240 of HM material with a width substantially equal to $0.5 L_0$ (one-half the width of the mat guiding stripes 204 in FIG. 2B) and with a pitch $L_0$ (one half the pitch of the mat guiding stripes 204 in FIG. 2B). The HM pillars 240 can be used as an etch mask in a $CHF_3/CF_4$ RIE step to etch the substrate base, which would result in an etched substrate with spaced bars and recesses like that shown in FIGS. 1C-1D. As described previously, the etched substrate may be used as an imprint template for use in making patterned-media magnetic recording disks and in semiconductor manufacturing, for example, for patterning parallel generally straight lines in MPU, DRAM and NAND flash devices.

Figure 3:
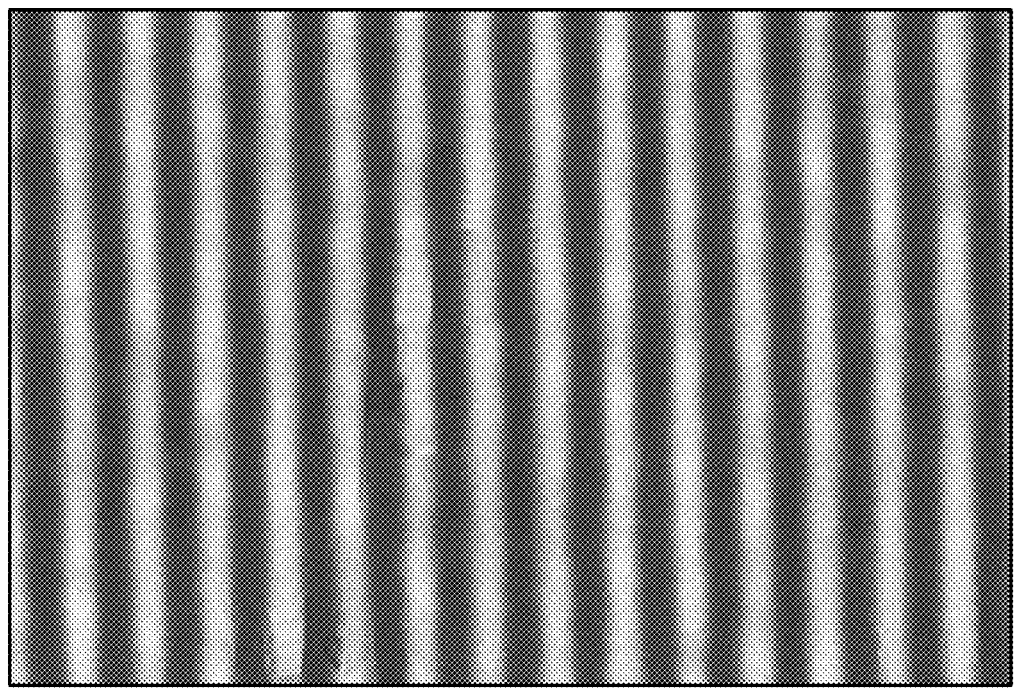
FIG. 3 is a scanning electron microscopy (SEM) image of a top view of the guiding stripe pattern on the diamond-like carbon (DLC) hard mask (HM) layer, after oxygen reactive ion etching (RIE) and before removal of the resist stripes.

FIG. 3 is a scanning electron microscopy (SEM) image of a top view of the guiding stripe pattern on the DLC HM layer, after oxygen reactive ion etching (RIE) and before removal of the resist stripes, where the white lines are the remaining resist stripes on top of the mat guiding stripes.

Figure 4:
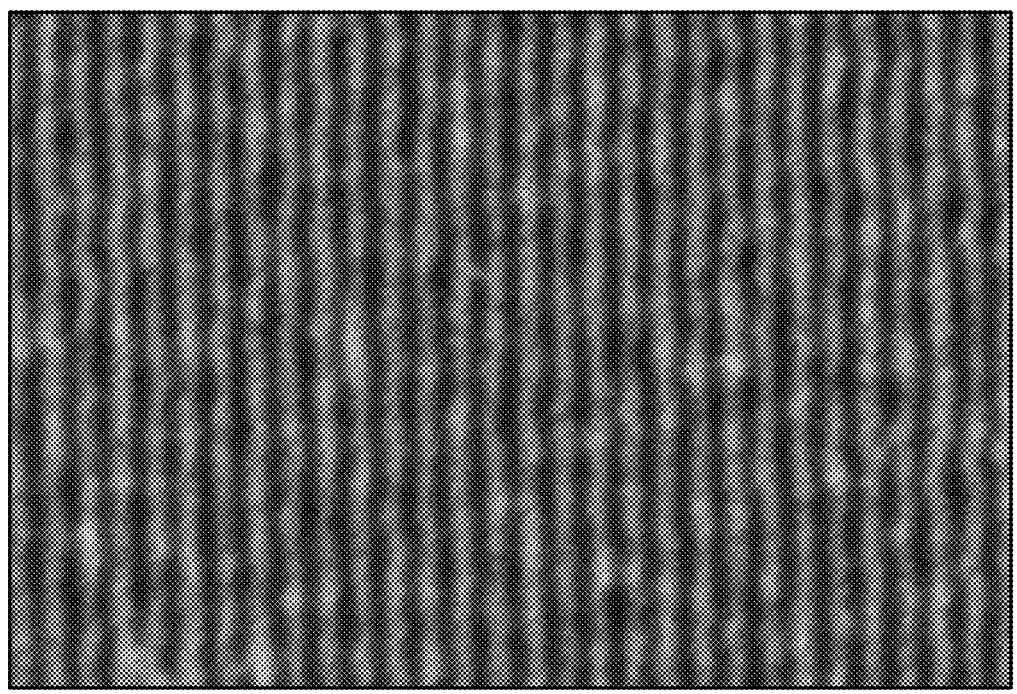
FIG. 4 is a SEM image of a top view of the BCP after self-assembly, corresponding to the schematic of FIG. 2E.

FIG. 4 is a SEM image of a top view of the BCP after self-assembly of the PTMSS-b-PMOST, corresponding to the schematic of FIG. 2E, where the white lines are the PTMSS.

Figure 5:
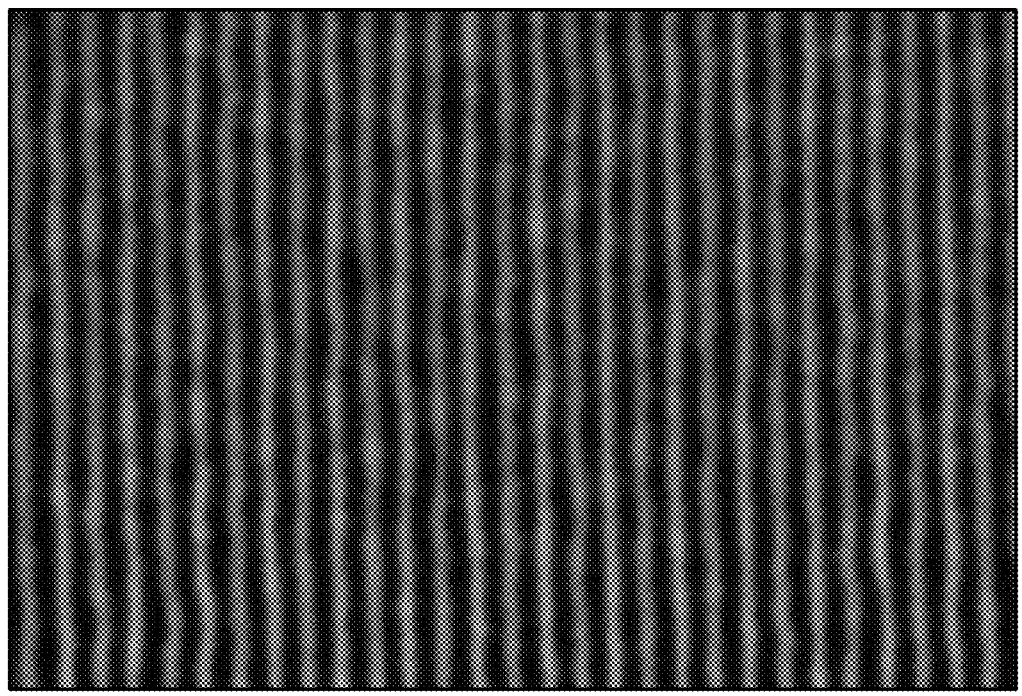
FIG. 5 is a SEM image of a top view after oxygen reactive ion etching (RIE) to remove one of the BCP components, corresponding to the schematic of FIG. 2F.

FIG. 5 is a SEM image of a top view after oxygen RIE to remove the PMOST component, corresponding to the schematic of FIG. 2F, where the white lines are the oxidized PTMSS.

Figure 6:
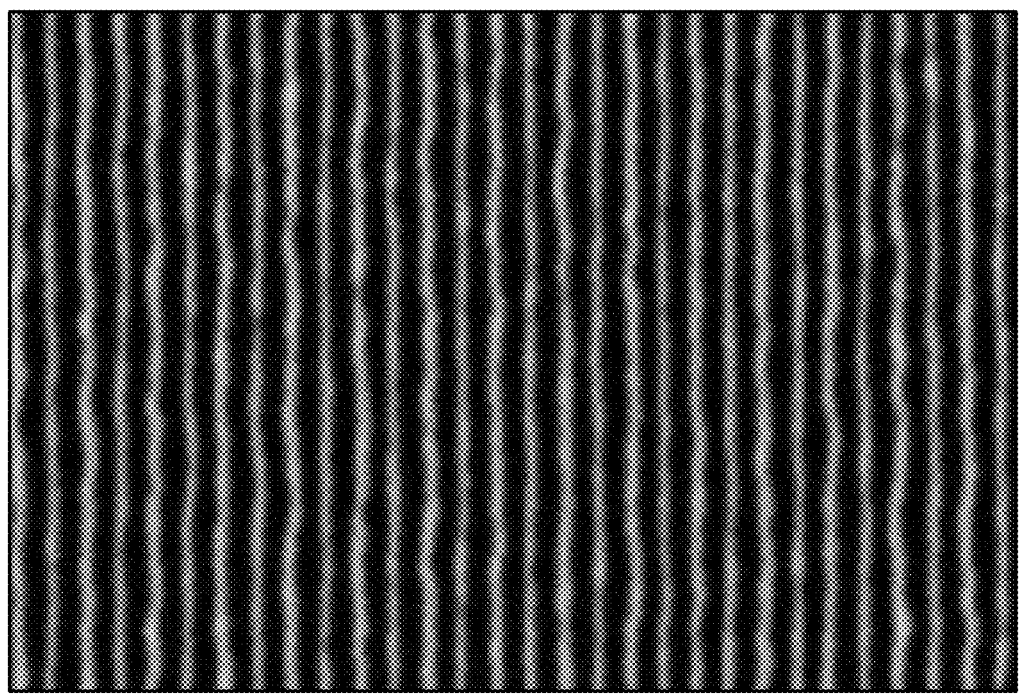
FIG. 6 is a SEM image of a top view after $CO_2$ RIE to etch the DLC HM layer, corresponding to the schematic of FIG. 2G.

FIG. 6 is a SEM image of a top view after the $CO_2$ RIE process to etch the DLC HM layer, using the oxidized PTMSS pillars as an etch mask, corresponding to the schematic of FIG. 2G, where the white lines are the oxidized PTMSS on top of the etched HM.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method of directed self-assembly (DSA) of a block copolymer (BCP) having a natural pitch $L_0$ comprising:
    providing a substrate;
    forming on the substrate a cross-linked polymer mat layer;
    patterning on the mat layer a resist layer into a plurality of spaced resist stripes having a width substantially equal to $nL_0$ and a pitch substantially equal to $(n+k)L_0$, where n and k are integers equal to or greater than 1;
    reactive ion etching the exposed mat layer in an oxygen gas to remove the mat layer between the resist stripes and simultaneously oxidize the sidewalls of stripes of mat layer beneath the resist stripes, leaving a plurality of mat guiding stripes with oxidized sidewalls, the guiding stripes having a width substantially equal to $nL_0$ and a pitch substantially equal to $(n+k)L_0$, where n and k are integers equal to or greater than 1;
    removing the resist;
    depositing onto the substrate between the guiding stripes a layer of polymer brush material;
    heating the polymer brush material to bind it to the substrate;
    removing unbound polymer brush material, leaving bound polymer brush material between the guiding stripes and having a thickness less than the thickness of the guiding stripes, thereby exposing the oxidized sidewalls of the guiding stripes;
    depositing a BCP comprising first and second BCP components on the guiding stripes and bound brush material; and
    heating said deposited BCP to cause one of the components to wet the oxidized sidewalls and the BCP to self-assemble into said first and second components on the guiding stripes and bound brush material.

2. The method of claim 1 wherein the polymer mat layer is cross-linked polystyrene.

3. The method of claim 1 wherein the polymer brush material is OH-terminated polystyrene.

4. The method of claim 1 wherein the substrate is formed of a material selected from single-crystal Si, amorphous Si, silica, fused quartz, silicon nitride, carbon, tantalum, molybdenum, chromium, alumina and sapphire.

5. The method of claim 1 wherein the substrate comprises a base selected from single-crystal Si, amorphous Si and fused quartz, and a hard mask layer formed on said base.

6. The method of claim 1 further comprising depositing a hard mask layer is comprising diamond-like carbon (DLC) on the substrate prior to forming the polymer mat layer.

7. The method of claim 1 wherein the BCP has a natural pitch $L_0$ less than 20 nm.

8. The method of claim 1 wherein the BCP is a silicon-containing BCP.

9. The method of claim 8 wherein the BCP is selected from poly(trimethylsilyl styrene)-block-poly(methoxystyrene) (PTMSS-b-PMOST), poly(styrene-block-dimethylsiloxane) (PS-b-PDMS), poly(trimethylsilylstyrene-block-D,L lactide) (PTMSS-b-PLA), and poly(styrene-block-trimethylsilylstyrene-block-styrene) (PS-b-PTMSS-b-PS).

10. The method of claim 1 further comprising, prior to heating the depositing BCP, spin-coating a polarity-switching topcoat on the deposited BCP.

11. The method of claim 1 wherein the difference in thickness between the mat guiding stripes and the bound brush material is greater than or equal to 2 nm and less than or equal to 10 nm.

12. The method of claim 1 wherein patterning the resist layer into a plurality of spaced resist stripes comprises patterning the stripes into a pattern selected from parallel stripes, concentric rings and generally radial lines.

13. A method for etching a substrate comprising:
the method of claim 1;
after the BCP has self-assembled, removing one of said first and second BCP components;
etching the substrate, using the other of said first and second BCP components as an etch mask; and
thereafter removing said other BCP component, leaving the etched substrate.

14. A method for etching a substrate using directed self-assembly (DSA) of a block copolymer (BCP) having a natural pitch $L_0$ comprising:
providing a substrate comprising a base selected from single-crystal Si, amorphous Si and fused quartz, and a hard mask layer formed on said base;
forming on the hard mask layer a cross-linked polymer mat layer;
patterning on the mat layer a resist layer into a plurality of spaced resist stripes having a width substantially equal to $nL_0$ and a pitch substantially equal to $(n+k)L_0$, where n and k are integers equal to or greater than 1;
reactive ion etching the exposed mat layer in an oxygen gas to remove the mat layer between the resist stripes, leaving a plurality of mat guiding stripes with oxidized sidewalls, the guiding stripes having a width substantially equal to $nL_0$ and a pitch substantially equal to $(n+k)L_0$, where n and k are integers equal to or greater than 1;
removing the resist;
depositing onto the substrate between the guiding stripes a layer of polymer brush material;
heating the polymer brush material to bind it to the substrate;
removing unbound polymer brush material, leaving bound polymer brush material between the guiding stripes and having a thickness less than the thickness of the guiding stripes, thereby exposing the oxidized sidewalls of the guiding stripes;
spin-coating a BCP comprising a first silicon-containing component and a second BCP component on the guiding stripes and bound brush material;
spin-coating a polarity-switching topcoat on the BCP;
heating said deposited BCP to cause the second BCP component to wet the oxidized sidewalls and the BCP to thereby self-assemble into said first and second components on the guiding stripes and bound brush material;
after the BCP has self-assembled, removing the second BCP component;
etching the hard mask layer, using the first silicon-containing BCP component as an etch mask; and
etching the substrate base, using the etched hard mask layer as a mask, leaving the etched substrate base.

15. The method of claim 14 wherein the polymer mat layer is cross-linked polystyrene.

16. The method of claim 14 wherein the BCP has a natural pitch $L_0$ less than 20 nm.

17. The method of claim 14 wherein the difference in thickness between the mat guiding stripes and the bound brush material is greater than or equal to 2 nm and less than or equal to 10 nm.

18. The method of claim 14 wherein the hard mask layer comprises diamond-like carbon (DLC).

19. The method of claim 14 wherein the BCP is selected from poly(trimethylsilyl styrene)-block-poly(methoxystyrene) (PTMSS-b-PMOST), poly(styrene-block-dimethylsiloxane) (PS-b-PDMS), poly(trimethylsilylstyrene-block-D,L lactide) (PTMSS-b-PLA), and poly(styrene-block-trimethylsilylstyrene-block-styrene) (PS-b-PTMSS-b-PS).

20. The method of claim 14 wherein patterning the resist layer into a plurality of spaced resist stripes comprises patterning the stripes into a pattern selected from parallel stripes, concentric rings and generally radial lines.

* * * * *